United States Patent [19]
Sakurai

[11] Patent Number: 4,575,602
[45] Date of Patent: Mar. 11, 1986

[54] APPARATUS FOR FORMING BONDING BALLS ON BONDING WIRES

[75] Inventor: Keizou Sakurai, Tokyo, Japan

[73] Assignee: NEC Corporation, Tokyo, Japan

[21] Appl. No.: 726,482

[22] Filed: Apr. 24, 1985

[30] Foreign Application Priority Data

Apr. 26, 1984 [JP]  Japan .................................. 59-84437

[51] Int. Cl.$^4$ ............................................. B23K 31/00
[52] U.S. Cl. .................................. 219/56.21; 228/4.5
[58] Field of Search ...................... 219/56, 56.1, 56.21, 219/56.22; 228/4.5

[56] References Cited

U.S. PATENT DOCUMENTS

| | | | |
|---|---|---|---|
| 4,323,759 | 4/1982 | Edson et al. | 219/56.22 |
| 4,387,283 | 6/1983 | Peterson et al. | 219/56.22 |
| 4,390,771 | 6/1983 | Kurtz et al. | 219/56.21 |

*Primary Examiner*—Clifford C. Shaw
*Attorney, Agent, or Firm*—Laff, Whitesel, Conte & Saret

[57] ABSTRACT

There is disclosed an improved apparatus for forming a bonding ball on a tip end of the bonding wire. There are provided a capillary member having a through-hole for holding and guiding the bonding wire, and a cylindrical member having an inner diameter larger than the outer diameter of said capillary member and located in a substantially coaxial relation to the capillary member. The cylindrical member is adapted to be reciprocated in the same direction as that of movement of the capillary member but at a velocity slower than the moving velocity of said capillary member. Further, the cylindrical member is ceaselessly supplied with an inert gas. When the tip end of the bonding wire held by the capillary member is moved into the inside space of the cylindrical member because of the moving velocity difference between the capillary member and the cylindrical member in the upward stroke of the reciprocation of the two members, the tip end of the bonding wire is molten so as to form a bonding ball in the inert gas formed within the cylindrical member.

20 Claims, 6 Drawing Figures

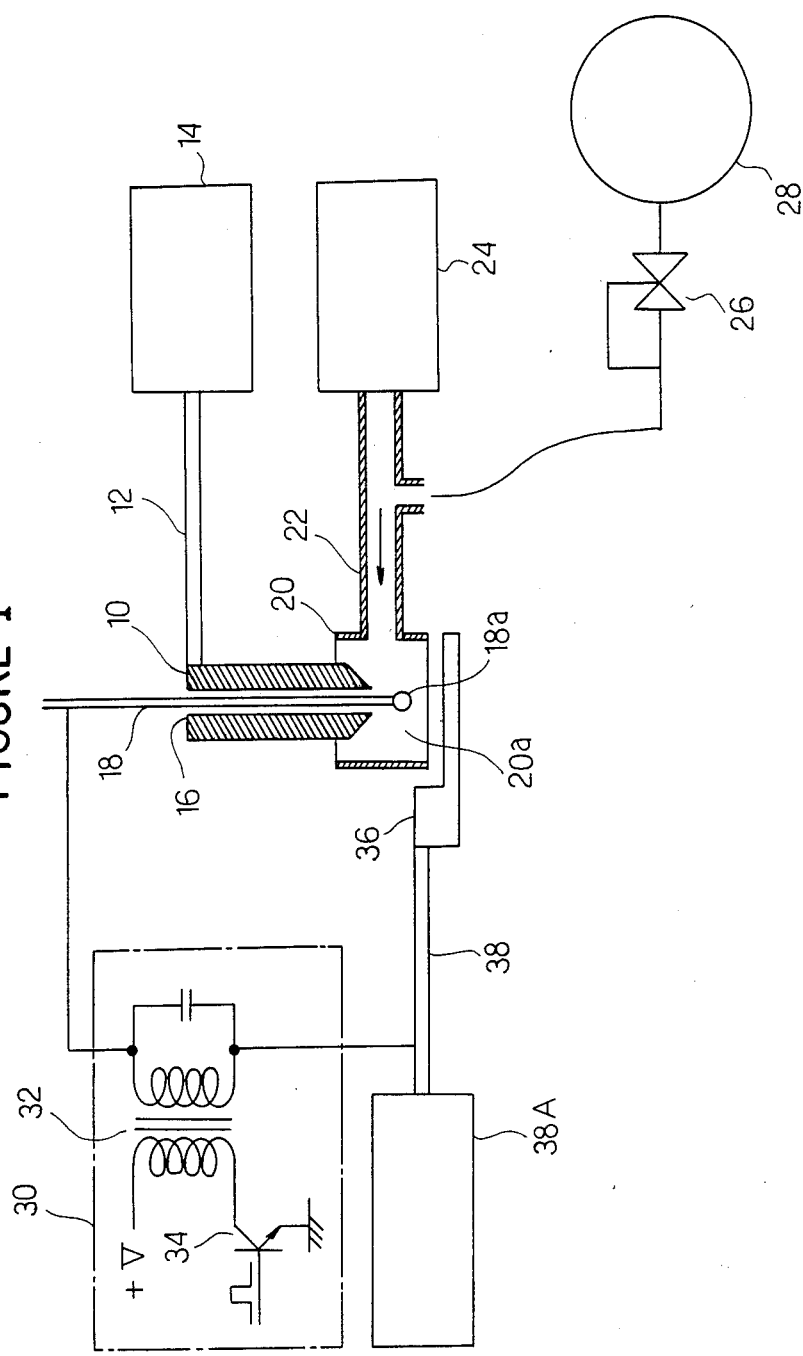

APPARATUS FOR FORMING BONDING BALLS ON BONDING WIRES

BACKGROUND OF THE INVENTION

1. Field of the Invention

The present invention relates to a wire bonder used for wiring in integrated circuit assembling process, and more specifically to an apparatus for forming a bonding ball on a tip end of a bonding wire used in such a wire bonder.

2. Description of Related Art

In integrated circuit assembly processes, after an IC chip has been die-bonded on a package substrate, fine aluminum or gold wires are used to make electrical connection between metallized pads on the IC chip and external terminal leads formed on the package substrate. These wires are bonded one at a time, each wire requiring two bonds to be made. Such wire-bonding techniques include thermocompression bonding (pressure and heat), ultrasonic bonding (friction of wire results in melting and alloying of wire), and thermosonic bonding (a combination of the two processes).

Among these wire bonding methods, the ultrasonic bonding of aluminum (Al) wires is advantageous in that (1) since the Al wires can be bonded at an ambient temperature a thermal influence to the bonding portion is very small; and (2) since Al-Al connection can be realized without insulative intermetallic compound, the bonding portion is reliable. However, the ultrasonic bonding has such disadvantages that since the bonding has directionality, not only the wire bonder has to have a complicated structure, but also the bonding speed is relatively low.

On the other hand, the thermocompression bonding is ordinarily performed by melting a tip end of bonding wire so as to form a metal ball and then depressing the metal ball to a portion to be bonded on an IC chip. Therefore, this method is particularly called "ball bonding" or "nailhead" method. This ball bonding method is advantageous over the ultrasonic bonding method in that the bonding has no directionality, and therefore, workability of bonding is very excellent.

Conventionally, a gold wire is used for the ball bonding. However, the gold needs a high material cost, and since the ball bonding of gold wire has to be performed while maintaining the IC clip at a temperature considerably higher than an ambient temperature, an intermetallic compound is formed in the bonding portion.

In order to eliminate the above problems, there has been proposed to perform the ball bonding by using an aluminum (Al) wire instead of the gold wire. The Al has a much lower and more stable material cost. Furthermore, the Al wire does not form an insulative intermetallic compound between the bonding wire and aluminum external leads which are at present widely used in IC and LSI packages, and also, the Al wire can be bonded at a chip temperature considerably lower than that required for gold ball bonding, namely at a room temperature.

However, the ball bonding of Al wire has one significant problem. Namely, when the Al wire is molten so as to form an Al ball on a tip end of the Al wire, the Al takes part in a chemical reaction with oxygen in atmospheric air, so that the resulting Al ball has not only a rough surface but also a hard coating of oxide formed on the surface. As a result, when the bonding is carried out, electrical connection often becomes defective, or the contact surface of the IC chip is damaged.

In view of these defects, melting of an Al wire tip end in an inert gas atmosphere has been proposed in U.S. Pat. No. 4,387,283, issued to Peterson et al on June 7, 1983. Referring to FIGS. 4 to 6 of this U.S. Patent, the mechanism for forming an Al ball on a tip end of an Al bonding wire includes a capillary tube 51 having a very thin through-hole for supporting and guiding an aluminum wire 53. An electrode 59 is positioned beneath the tip 55 of the capillary tube 51, and a nozzle 49 is located in an inclined condition to inject an inert gas such as argon toward a gap 67 formed between the electrode 59 and the tip end 57 of the Al wire 53.

With this arrangement, an inert gas is injected from the nozzle 49 to form and maintain an inert gas atmosphere around the tip end 57 of the Al wire 53. In this condition, an electric voltage is applied between the capillary tube 51 and the electrode 59, so that an arc discharge takes place between the tip end 57 of the Al wire and the electrode 59. As a result, the heat generated by the arc discharge melts the Al wire to form an Al ball 94 on the Al wire tip end. At this time, the Al wire and the Al ball is prevented from oxidation by the inert gas atmosphere.

In order to perfectly prevent oxidation of the Al bonding bail, it is necessary to perfectly surround the tip end of the Al wire with the inert gas. However, since the periphery of the tip end is an opened space, the inert gas injected towards the tip end cannot be held around the tip end. Therefore, it is necessary to ceaselessly inject a large amount of inert gas to the tip end of the Al wire, so as to maintain a shield of pure inert gas around the tip end. Because of this, an inert gas was injected at the rate of 2000 $cm^3$/minute in a typical example. However, if a large amount of inert gas is injected from the nozzle towards the tip end of the Al wire, the formed Al ball 76 is deviated from the center axis 74 of the Al wire as shown in FIG. 2 of U.S. Pat. No. 4,387,283. This is because the injected inert gas flow must be brought into a high pressure for increase of flow amount. If the bonding ball is deviated from the center axis line of the Al wire, the bonding ball cannot often be contacted to a desired point of a contact pad. This is a cause for defective connection. On the other hand, if the injected gas amount is decreased so as to prevent the formed Al ball from being deviated from the Al wire center axis, the atmospheric air will mix with the injected inert gas around the Al wire tip end, so that the Al ball cannot be perfectly protected from oxidation.

SUMMARY OF THE INVENTION

Accordingly, it is an object of the present invention to provide an apparatus for forming bonding balls on bonding wires, which is capable of forming bonding balls on the center axis of the bonding wire without oxidation of bonding balls and with a relatively small amount of inert gas injected toward to the tip end of the bonding wire.

Another object of the present invention is to provide an apparatus for forming a non-oxidized aluminum bonding ball at the tip end of an aluminum bonding wire on the center axis of bonding wire by producing an pure inert gas atmosphere perfectly surrounding the tip end of the bonding wire with only a small amount of inert gas.

The above and other objects of the present invention are achieved according to the present invention by an apparatus for forming bonding balls on bonding wires in a ball bonding machine, the machine including a capillary member having a through-hole for holding and guiding a bonding wire and adapted to be vertically reciprocated so as to cause the tip end of the bonding wire held by the capillary member to displace towards and apart from a surface to be wire-bonded. The bonding ball forming apparatus comprises a cylindrical member having an inner diameter larger than the outer diameter of said capillary member and located in a substantially coaxial relation to said capillary member. Said cylindrical member is adapted to be reciprocated in the same direction as that of movement of said capillary member but at a velocity slower than the moving velocity of said capillary member. Furthermore, there is provided means for supplying a non-oxidizing gas into said cylindrical member so as to substantially fill the inside space of said cylindrical member with said non-oxidizing gas. In addition, means is provided for melting the tip end of said bonding wire. This melting means is activated, when said tip end of said bonding wire held by said capillary member is moved into the inside space of said cylindrical member because of the moving velocity difference between said capillary member and said cylindrical member in the upward stroke of the reciprocation of said two members, whereby said tip end of said bonding wire is molten in said non-oxidizing gas atmosphere within said cylindrical member, so as to form a bonding ball.

In the above bonding ball forming apparatus, the injected non-oxidizing gas is temporarily confined in the cylindrical member, and then, is discharged from the opposite ends of the cylindrical member into the atmospheric air. Therefore, a pure non-oxidizing gas atmosphere can be formed within the cylindrical member even if only a small amount of non-oxidizing gas is supplied. Accordingly, since the tip end of the bonding wire is molten in such a pure non-oxidizing gas atmosphere to form a bonding ball, the bonding ball is perfectly protected from oxidation. In addition, since the pressure of the injected non-oxidizing gas is made very low by supplying a small flow amount of gas, the bonding ball cannot be deviated from the center axis of the bonding wire by the injected gas flow.

Therefore, the bonding ball is formed on the center axis of the bonding wire with a smooth surface but without a coating of oxide. Accordingly, the ball bonding can be made without defective connection and damage to the chip pad surface.

In an embodiment of the ball forming apparatus in accordance with the present invention, said gas supplying means is adapted to ceaselessly supply said non-oxidizing gas to said cylindrical member at the rate of not less than 50 cm$^3$/minute, preferably at the rate of 100 cm$^3$/minute, and said non-oxidizing gas is an inert gas such as argon.

In one embodiment of the present invention, said cylindrical member is a single wall cylinder, and said gas supplying means is a gas supplying pipe having one end connected to the side wall of said cylinder and to open at the inner side wall surface of said cylinder.

In another embodiment of the present invention, said cylindrical member is constituted of a pipe wound in the form of a coil having plural turns and coaxial with said capillary member, said coiled pipe being connected at its one end to said gas supplying means and having a plurality of holes formed through a pipe wall portion thereof positioning at the inside of said coil.

Preferably, the bonding wire is an aluminum wire, and said melting means is an arc discharge mechanism constituted of said bonding wire itself and an electrode which is movable in a substantial horizontal direction between an extruded position crossing the center axis line of the bonding wire portion held by said capillary member when said capillary member and said cylindrical member are in an elevated position and a retracted position separated sufficiently from said capillary member when said capillary member and said cylindrical member are in a lowered position. With this arrangement, when said tip end of said bonding wire is moved into the inside space of said cylindrical member and said electrode is moved beneath said tip end of said bonding wire, a voltage is applied between said bonding wire and said electrode, so that an arc discharge occurs between said electrode and said tip end of said bonding wire so as to melt said tip end and to form a bonding ball.

The above and other objects, features and advantages of the present invention will be apparent from the following description of preferred embodiments of the invention with reference to the accompanying drawings.

BRIEF DESCRIPTION OF THE DRAWINGS

FIG. 1 is a diagrammatical view showing one embodiment of the bonding ball forming apparatus in accordance with the present invention;

DESCRIPTION OF THE PREFERRED EMBODIMENTS

Figure 2A:
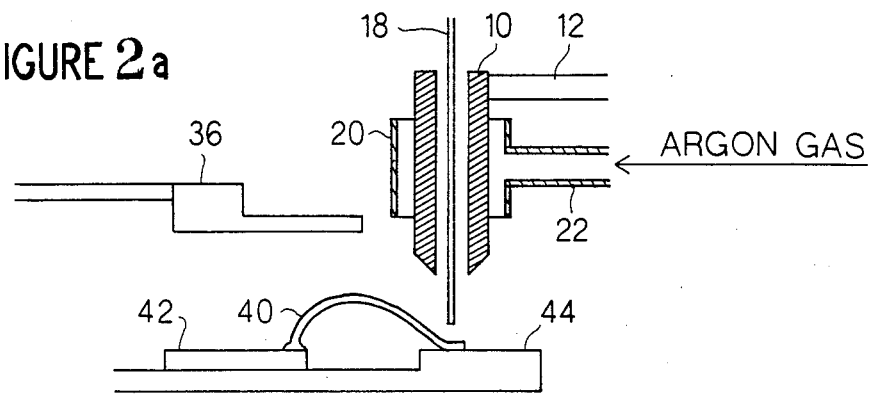
FIG. 2a, 2b and 2c are partial sectional views showing different conditions of the capillary member, the cylindrical member and the discharge electrode in the ball forming apparatus shown in FIG. 1.

Referring to FIG. 1, the shown ball forming apparatus comprises a capillary member 10 which constitutes a part of a ball bonding machine. The capillary member 10 is mounted at its upper end on one end of an arm 12, whose other end is connected to a vertically reciprocating mechanism diagrammatically shown by Block 14, so that the capillary member 10 can be vertically reciprocated. The capillary member 10 has for example the outer diameter of 3.175 mm and the length of 11.1 mm. In addition, the capillary member 10 has a very thin through-hole 16 extending vertically from an upper end to a lower end. A bonding wire 18 such as an aluminum wire is slidably inserted through the hole 16 to project from the lower end of the capillary member 10.

Furthermore, there is provided a cylindrical member 20 constituted of a short pipe having an inner diameter larger than the outer diameter of the capillary member 10. For example, the inner diameter of the cylindrical member 20 is 4.5 mm. The cylindrical member 20 is supported at its middle portion by a pipe arm 22 such that the cylindrical member 20 is in a coaxial relation to the capillary member 10. The pipe arm 22 is connected to another vertically reciprocating mechanism diagrammatically shown by Block 24, so that the cylindrical member 20 can be vertically reciprocated together with the capillary member 10 while maintaining the coaxial relation between the capillary member 10 and the cylindrical member 20. However, the reciprocation of the cylindrical member 20 is smaller in stroke and slower in velocity than the capillary member 10. In addition, it is adjusted such that when the capillary member 10 and the cylindrical member 20 are in respective lowermost positions, the lower end of the capillary member 10 is sufficiently extruded from the lower end of the cylindrical member 20, and on the other hand, when the two members 10 and 20 are in respective uppermost positions, the lower end of the capillary member 10 is positioned substantially at a center of the inside space defined by the cylindrical member 20.

The pipe arm 22 is opened at the inner side wall of the cylindrical member 20 and is connected through a flow controlling valve 26 to a tank 28 of an inert gas such as argon.

The bonding wire 18 is connected to one output terminal of a voltage source 30, which can be constituted of a step-up transformer 32 and a switching transistor 34 connected to a primary winding of the transformer 32 so as to intermittently energize the primary winding. The other terminal of the voltage source 30 is connected to a discharge electrode 36. This discharge electrode 36 is fixed to a arm 38 which is horizontally reciprocated by a driving mechanism diagrammatically shown by Block 38A at such a timing that, when the capillary member 10 and the cylindrical member 20 are in the respective elevated positions, the electrode 37 can take an extruded position crossing the center axis line of the bonding wire 18 held by the capillary member 20, and when the capillary member 10 and the cylindrical member 20 are in the respective lowered positions, the electrode 36 can take a retracted position separated sufficiently apart from the two members 10 and 20.

Figure 3:
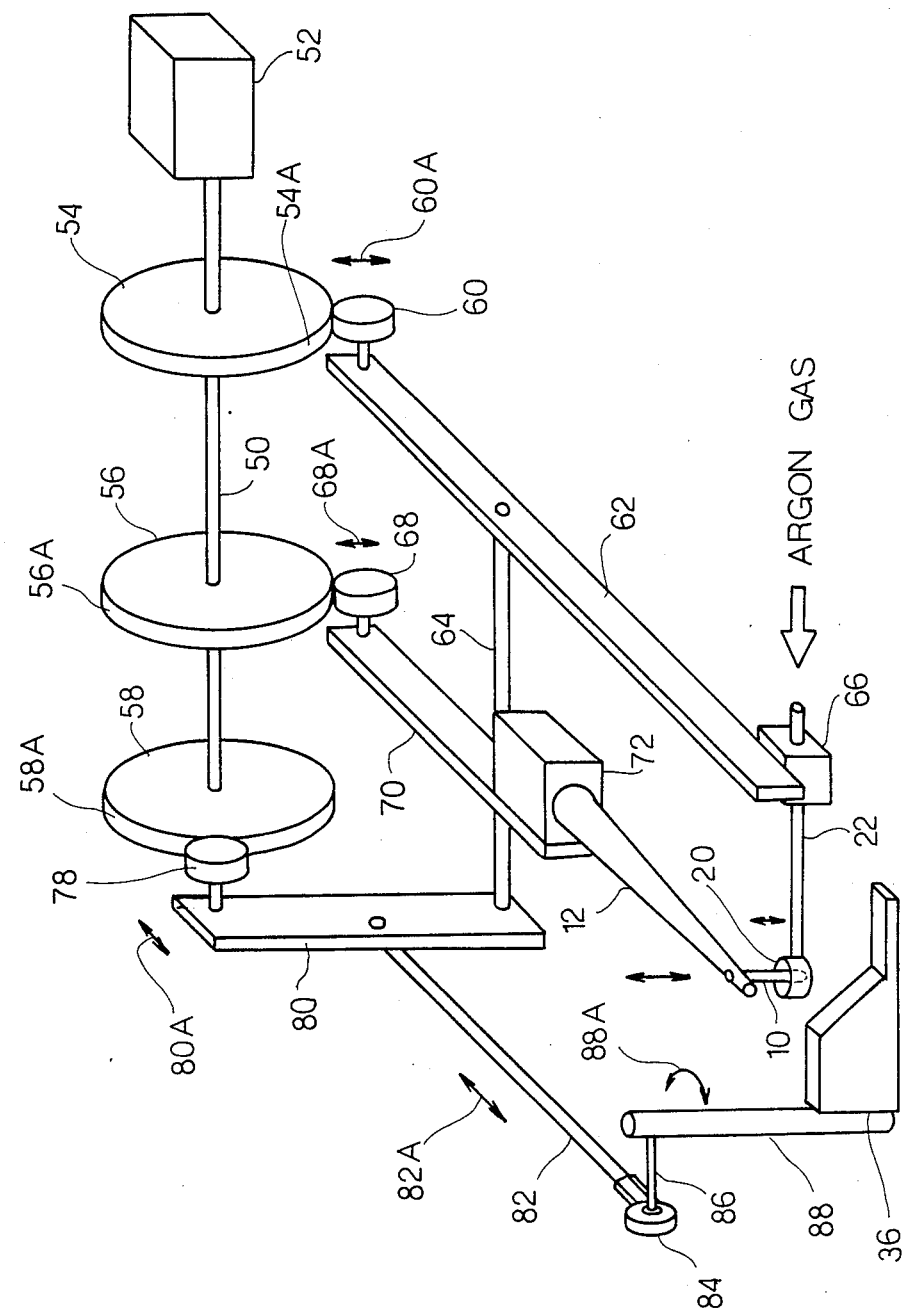
FIG. 3 is a diagrammatical perspective view showing the drving mechanism for the capillary member, the cylindrical member and the discharge electrode shown in FIG. 1.

The aforementioned synchronized operation of the capillary member 10, the cylindrical member 20 and the discharge electrode 38 can be achieved by for example a cam mechanism shown in FIG. 3. The shown cam mechanism comprises a rotating shaft 50 driven by a motor 52 such as an electric motor. The rotating shaft 50 is fixedly provided with three cams 54 for rotation together. These cams are separated from each other along the axis of the shaft 50. The cam 54 has an outer cam surface 54A which is at its lower end in contact with a cam follower 60 mounted on one end of an arm 62. This arm 62 is pivotally supported at its middle portion by a pivotal shaft 64, and is provided at the other end thereof with a block 66 which supports the pipe arm 22 of the cylindrical member 20. Therefore, the rotation of the cam 54 causes the vertical reciprocation of the cam follower 60 and hence the one end of the arm 62 in the direction shown by the arrow 60A, with the result that the other end of the arm 62 and hence the cylindrical member 20 will be vertically reciprocated.

Similarly, the cam 56 has an outer cam surface 56A which is at its lower end in contact with a cam follower 68 mounted on one end of an arm 70. This arm 70 is pivotally supported at its middle portion by the pivotal shaft 64. The arm 70 is also provided at the other end thereof with a block 72, which supports the base end of the arm 12 of the capillary member 10. Accordingly, with the rotation of the cam 56, the cam follower 68 and hence the one end of the arm 70 are vertically reciprocated as shown by the arrow 68A, so that the capillary member 10 is vertically reciprocated.

The cam 58 has an outer cam surface 58A and is contact with a cam follower 78 at a side of the cam surface 58A. The cam follower 78 is mounted on one end of a swinging arm 80 whose other end is pivotally supported by the shaft 64. To a middle portion of the arm 80 there is connected one end of a rod 82, whose other end is connected through a universal coupler 84 to another rod 86, which is in turn put in a substantial orthogonal relation to the connecting rod 82 and in a horizontal plane including the connecting rod 82. The other end of the rod 86 is fixed to an upper portion of a vertical shaft 88, which is supported to be rotatable in the direction of the arrow 88A. The vertical shaft 88 is fixed at its lower portion to the base portion of the discharge electrode 36.

Thus, if the cam 58 is rotated, the arm 80 is swung around the pivotal shaft 64 in the direction of the arrow 80A, so that the connected rod 82 is reciprocated is its longitudinal axis direction as shown by the arrow 82A. As a result, the rod 86 is swung in the horizontal plane around the vertical axis of the shaft 88 so as to reciprocatingly rotate the shaft 88 and the electrode 36 in the direction of the arrow 88A around the center axis of the vertical shaft 88.

With the above mentioned arrangement, the capillary member 10, the cylindrical member 20 and the discharge electrode 36 can be operated in synchronism with each other. In addition, although the cams 54, 56 and 58 are shown in the form of an elliptical disc for simplification of drawing, these cams actually have so sophisticated cam surface profiles that the capillary member 10 can be vertically moved at a velocity higher than the cylindrical member 20 and at the same time the discharge electrode 36 can be horizontally moved without obstruction to the capillary member 10 and the cylindrical member 20, in such a manner that when the capillary member 10 and the cylindrical member 20 are in the respective elevated positions, the lower end of the capillary member 10 is positioned substantially at a center of the inside space defined by the cylindrical member 20, and at the same time, the electrode 36 is brought to the extruded position crossing the center axis line of the bonding wire 18 held by the capillary member 20, and on the other hand, when the capillary member 10 and the cylindrical member 20 are in the respective lowered positions, the lower end of the capillary member 10 is sufficiently extruded from the lower end of the cylindrical member 20, and at the same time, the electrode 36 is put in the retracted positions separated sufficiently apart from the two members 10 and 20.

Next, explanation will be made to the operation of the above described ball forming apparatus with reference to FIGS. 2a, 2b and 2c.

During the all operation period of the apparatus, the inert gas is ceaselessly supplied to the cylindrical member 20 at a predetermined rate, for example at 100 cm$^3$/minute. FIG. 2a shows a condition in which one wire bonding process has been just completed for connecting the opposite ends of one wire 40 to a metallized pad of a IC chip 42 and a external terminal lead of a package substrate 44. At this time, the capillary member 10 and the cylindrical member 20 are already in the course of an upward stroke, but the lower end of the capillary member 10 still projects from the lower end of the cylindrical member 20. The discharge electrode 36 is in the retracted position.

Thereafter, the capillary member 10 and the cylindrical member 20 are further moved upwardly, but since the velocity of the capillary member 10 is larger than that of the cylindrical member 20, the lower end of the capillary member 10 is gradually retracted into the inside space of the cylindrical member 20. On the other hand, the discharge electrode 36 is gradually protruded. When the two members 10 and 20 reach the respective uppermost positions, the lower end of the capillary member 10 is positioned at the center of the inside space of the cylindrical member 20, and the electrode 36 is moved to its ultimate extruded position so that the elecrode 36 is on the center axis line of the bonding wire 18, as shown in FIG. 2b. At this time, a voltage is applied between the bonding wire 18 and the electrode 36 to generate arc discharge therebetween so that the tip end of the bonding wire 18 is molten and a bonding ball 18a is formed because of the surface tension of the molten metal. In this ball forming process, the bonding ball 18a is in no way oxidixed by oxygen in the air, because the interior 20a of the cylindrical member 20 is filled with the inert gas supplied through the pipe 22 without mixing with the oxygen in the air.

Specifically, the inert gas in the cylindrical member 20 is prevented from free diffusion by the side wall of the cylindrical member, and therefore, if a gas is ceaselessly supplied into the cylindrical member 20, the supplied gas will fill the interior 20a of the cylindrical member 20 and finally flow from the opposite ends of the cylindrical member 20. Accordingly, if such a gas flow is ensured in the cylindrical member 20, there is established in the cylindrical member 20 an inert gas atmosphere having substantially the same purity as that of the gas supplied to the cylindrical member 20, even if only a small flow amount of gas is supplied. Thus, since the tip end of the bonding wire 18 is molten in such pure inert gas atmosphere, the bonding ball is formed to have a smooth surface without a coating of oxide. Furthermore, since the inert gas atmosphere is formed with a small flow amount of gas, the bonding ball can be formed on the center axis line of the bonding wire 18 without deviation by the inert gas flow.

Thereafter, the capillary member 10 and the cylindrical member 20 are changed to the downward stroke, and the electrode 36 is put in the retracting stroke. As mentioned above, since the velocity of the capillary member 10 is larger than that of the cylindrical member 20, the lower end of the capillary member 10 is projected from the lower end of the cylindrical member 20 at the proximity of the end of the downward stroke, and finally, the bonding ball 46 is depressed on another metallized pad of the IC chip 42 at the ultimate lowered position of the capillary member 10, as shown in FIG. 2c. At this time, the electrode 36 is perfectly in its retracted position so that it does not disturb the downward movement of the capillary member 10.

A general method including the aforementioned ball bonding of a tip end of the bonding wire and the following wire-bonding of the other end of the same bonding wire is referred to U.S. Pat. Nos. 4,098,447 and 3,641,660.

After the bonding wire is bonded to a lead on the package substrate 44 and cut from the bonding wire portion held by the capillary member 10, all of the members are returned to the condition shown in FIG. 2a, and then, the same process will be repeated.

Figure 2B:
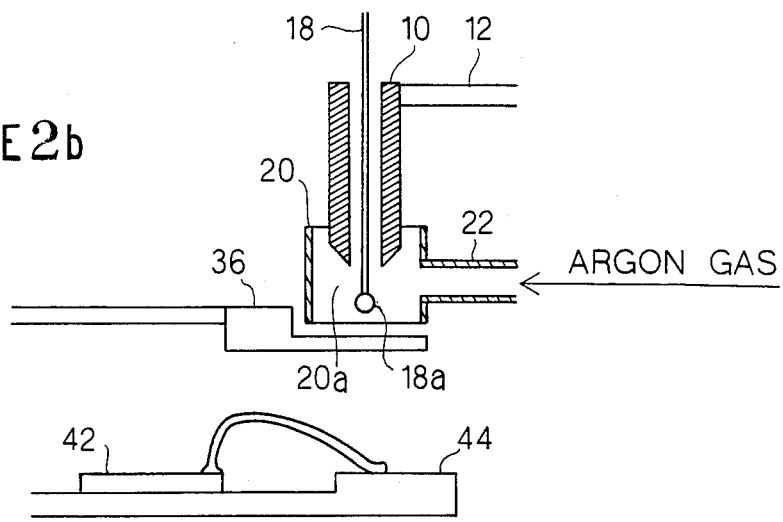
Figure 2C:
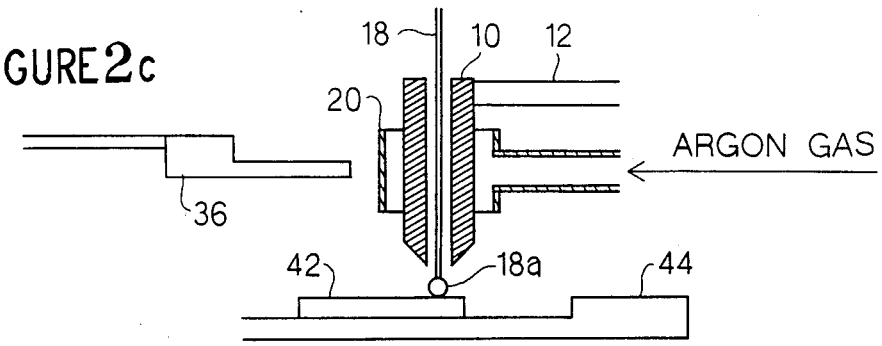
Figure 4:
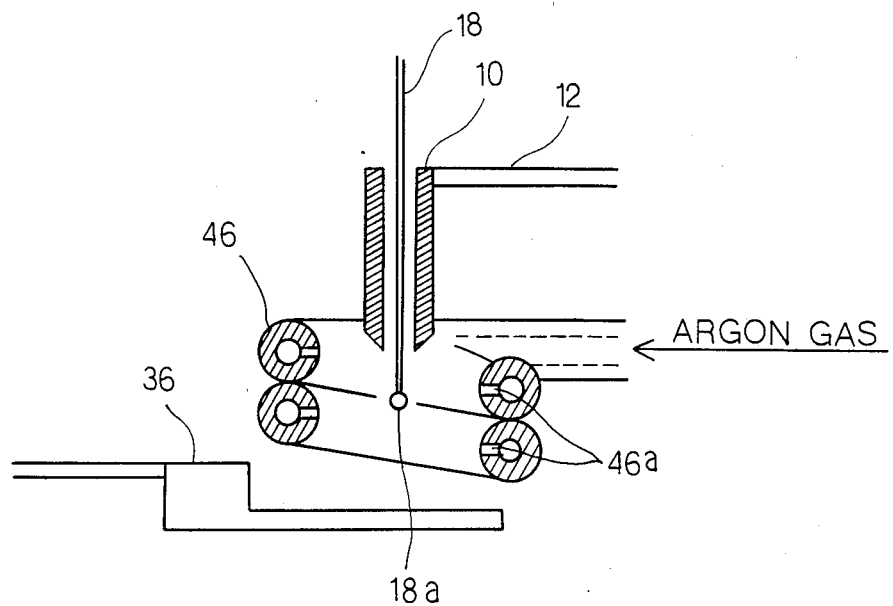
FIG. 4 is a partial sectional view showing an essential parts of another embodiment of the ball forming apparatus.

FIG. 4 shows another embodiment of the cylindrical member, but members similar to those shown in FIGS. 2a, 2b and 2c are given the same Reference Numerals. The shown cylindrical member is constituted of a pipe 46 wound in the form of a coil having plural turns and coaxial with the capillary member 10. This pipe 46 is connected at its one end to the inert gas supplying source as shown in FIG. 1 and has a plurality of holes 46a formed through a pipe wall portion thereof positioning at the inside of the coil.

In this embodiment, since the inert gas is injected to the tip end of the bonding wire 18 from different directions by the plural holes 46a, the bonding ball will be formed on the center axis line of the bonding wire 18, even if a large flow amount of inert gas is supplied.

The invention has thus been shown and described with reference to specific embodiments, however, it should be noted that the invention is in no way limited to the details of the illustrated structures but changes and modifications may be made within the scope of the appended claims.

I claim:

1. An improved apparatus for forming a bonding ball on a tip end of the bonding wire in a ball bonding machine, comprising a capillary member having a throughhole for holding and guiding the bonding wire and adapted to be vertically reciprocated so as to cause the tip end of the bonding wire held by the capillary member to displace towards and apart from a surface to be wire-bonded; a cylindrical member having an inner diameter larger than the outer diameter of said capillary member and located in a substantially coaxial relation to said capillary member, said cylindrical member being adapted to be reciprocated in the same direction as that of movement of said capillary member but at a velocity slower than the moving velocity of said capillary member; means for supplying a non-oxidizing gas into said cylindrical member so as to substantially fill the inside space of said cylindrical member with said non-oxidizing gas; and means for melting the tip end of said bonding wire, said melting means being activated when said tip end of said bonding wire held by said capillary member is moved into the inside space of said cylindrical member because of the moving velocity difference between said capillary member and said cylindrical member in the upward stroke of the reciprocation of said two members, whereby said tip end of said bonding wire is molten in said non-oxidizing gas within said cylindrical member so as to form a bonding ball.

2. An apparatus set forth in claim 1 wherein said gas supplying means is adapted to ceaselessly supply said non-oxidizing gas to said cylindrical member.

3. An apparatus set forth in claim 2 wherein said non-oxidizing gas is an inert gas.

4. An apparatus set forth in claim 3 wherein said inert gas is argon.

5. An apparatus set forth in claim 1 wherein said cylindrical member is a single wall cylinder and said gas supplying means is a gas supplying pipe having one end connected to the side wall of said cylinder and to open at the inner side wall surface of said cylinder.

6. An apparatus set forth in claim 5 wherein said gas supplying means is adapted to ceaselessly supply said non-oxidizing gas to said cylindrical member.

7. An apparatus set forth in claim 6 wherein said non-oxidizing gas is an inert gas.

8. An apparatus set forth in claim 7 wherein said inert gas is argon.

9. An apparatus set forth in claim 1 wherein said cylindrical member is constituted of a pipe wound in the form of a coil having plural turns and coaxial with said capillary member, said coiled pipe being connected at its one end to said gas supplying means and having a plurality of holes formed through a pipe wall portion thereof positioning at the inside of said coil.

10. An apparatus set forth in claim 9 wherein said gas supplying means is adapted to ceaselessly supply said non-oxidizing gas to said cylindrical member.

11. An apparatus set forth in claim 10 wherein said non-oxidizing gas is an inert gas.

12. An apparatus set forth in claim 11 wherein said inert gas is argon.

13. An apparatus set forth in claim 1 wherein said melting means is an arc discharge mechanism constituted of said bonding wire itself and an electrode which is movable in a substantial horizontal direction between an extruded position crossing the center axis line of the bonding wire portion held by said capillary member when said capillary member and said cylindrical member are in an elevated position and a retracted position separated sufficiently from said capillary member when said capillary member and said cylindrical member are in a lowered position, a voltage being applied between said bonding wire and said electrode when said tip end of said bonding wire is moved into the inside space of said cylindrical member and said electrode is moved beneath said tip end of said bonding wire, so that an arc discharge occurs between said electrode and said tip end of said bonding wire so as to melt said tip end and form a bonding ball.

14. An apparatus set forth in claim 13 wherein said gas supplying means is adapted to ceaselessly supply said non-oxidizing gas to said cylindrical member.

15. An apparatus set forth in claim 14 wherein said non-oxidizing gas is an inert gas.

16. An apparatus set forth in claim 15 wherein said inert gas is argon.

17. An apparatus set forth in claim 16 wherein said cylindrical member is a single wall cylinder and said gas supplying means is a gas supplying pipe having one end connected to the side wall of said cylinder and to open at the inner side wall surface of said cylinder.

18. An apparatus set forth in claim 16 wherein said cylindrical member is constituted of a pipe wound in the form of a coil having plural turns and coaxial with said capillary member, said coiled pipe being connected at its one end to said gas supplying means and having a plurality of holes formed through a pipe wall portion thereof positioning at the inside of said coil.

19. An apparatus set forth in claim 13 wherein said cylindrical member is a single wall cylinder and said gas supplying means is a gas supplying pipe having one end connected to the side wall of said cylinder and to open at the inner side wall surface of said cylinder.

20. An apparatus set forth in claim 13 wherein said cylindrical member is constituted of a pipe wound in the form of a coil having plural turns and coaxial with said capillary member, said coiled pipe being connected at its one end to said gas supplying means and having a plurality of holes formed through a pipe wall portion thereof positioning at the inside of said coil.

* * * * *